United States Patent [19]

Nakagawa

[11] 3,912,945

[45] Oct. 14, 1975

[54] SWITCHING CIRCUIT

[75] Inventor: Yutaka Nakagawa, Tokyo, Japan

[73] Assignee: Sony Corporation, Tokyo, Japan

[22] Filed: Sept. 3, 1974

[21] Appl. No.: 502,646

[30] Foreign Application Priority Data

Sept. 7, 1973 Japan .............................. 48-105053

[52] U.S. Cl. ........... 307/252 C; 307/252 J; 307/300

[51] Int. Cl.$^2$ .......................................... H03K 17/72

[58] Field of Search ........ 307/252 C, 252 J, 252 M, 307/300

[56] References Cited

UNITED STATES PATENTS

| | | | |
|---|---|---|---|
| 3,300,680 | 1/1967 | Saudinaitis | 307/252 C |
| 3,569,742 | 3/1971 | Schroeder | 307/300 X |
| 3,821,565 | 6/1974 | Horinaga | 307/252 C |
| 3,840,275 | 10/1974 | Takahashi | 307/252 C |

*Primary Examiner*—John Zazworsky
*Attorney, Agent, or Firm*—Lewis H. Eslinger; Alvin Sinderbrand

[57] ABSTRACT

A switching circuit having a biasing element connected between a driving signal supplying terminal and the control electrode of a switching element, a transistor whose base and emitter electrodes are connected across the biasing element and a capacitor connected between the collector electrode of the transistor and a reference voltage.

3 Claims, 10 Drawing Figures

SWITCHING CIRCUIT

BACKGROUND OF THE INVENTION

1. Field of the Invention

The present invention relates generally to a switching circuit, and more particularly to a switching circuit for use with the horizontal deflection circuit of a television receiver.

2. Description of the Prior Art

In a prior art horizontal deflection circuit shown in FIG. 1, a so-called gate controlled switch device 1 which will be hereinafter referred to simply as a GCS, is employed as a switching element. In the prior art shown in FIG. 1, a choke coil 2 is inserted between the anode electrode of the GCS 1 and a voltage source of +B. The anode electrode of the GCS 1 is further connected with a damper diode 3, a resonance capacitor 4 and a horizontal deflection coil 5, respectively, and the gate electrode of the GCS is connected through a driving transformer 6 to a driving transistor 7.

In this case, since the driving transformer 6 is not an ideal transformer but has a leakage inductance, an inductor L is connected to the secondary side of the driving transformer 6 from equivalent point of view. Accordingly, when the driving voltage signal therefrom becomes to a negative one −E and a gate current $I_G$ of the GCS 1 is changed from a positive value to a negative value or an electric charge is derived from the gate electrode of the GCS 1, as shown in FIG. 2, a so-called storage time $T_S$ is increased and, consequently the GCS 1 is not switched abruptly from ON to OFF as shown in FIG. 3. If a transformer is so formed that its leakage inductance is small, the storage time Ts can be made short by some extent. However, the shortening of the storage time Ts is limited and also it is difficult to make such a transformer with short storage time.

Another prior art horizontal deflection circuit is shown in FIG. 4. In the circuit of FIG. 4, a choke coil 8 with a tap is used in place of the driving transformer 6 in FIG. 1 and a capacitor 9 for blocking the passage of a DC current and a choke coil 10 are connected to the tap of the choke coil 8. The other circuit construction is substantially same as those of FIG. 1. The horizontal deflection circuit of FIG. 4, however, can not be free from the defects of that shown in FIG. 1.

SUMMARY OF THE INVENTION

According to the present invention there is provided a switching circuit which comprises means for producing a driving signal, a switching element having at least a control electrode, a biasing element connected between said driving signal producing means and the control electrode of said switching element, a transistor having base, emitter and collector electrodes, the base-emitter path of said transistor being connected across said biasing element, and a capacitor connected between the collector electrode of said transistor and a reference voltage.

Accordingly, it is an object of the present invention to provide a switching circuit free from the defects encountered in the prior art.

It is another object of the invention to provide a swithing circuit simple in construction but free from the defects.

It is a further object of the invention to provide a switching circuit for use with a television receiver.

The additional and other objects, features and advantages of the invention will become apparent from the following description taken in conjunction with the accompanying drawing.

DESCRIPTION OF THE PREFERRED EMBODIMENTS

Figure 1:
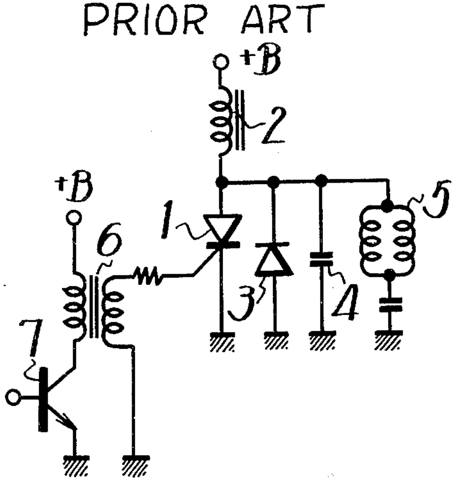
FIG. 1 PRIOR ART
FIG. 1 is a connection diagram showing a prior art horizontal deflection circuit.
Figure 2:
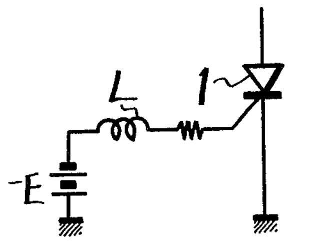
FIG. 2 is a diagram of its equivalent circuit.
Figure 3:
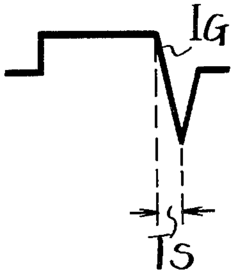
FIG. 3 is a waveform diagram used for explaning the operation of the circuit shown in FIG. 1.
Figure 5:
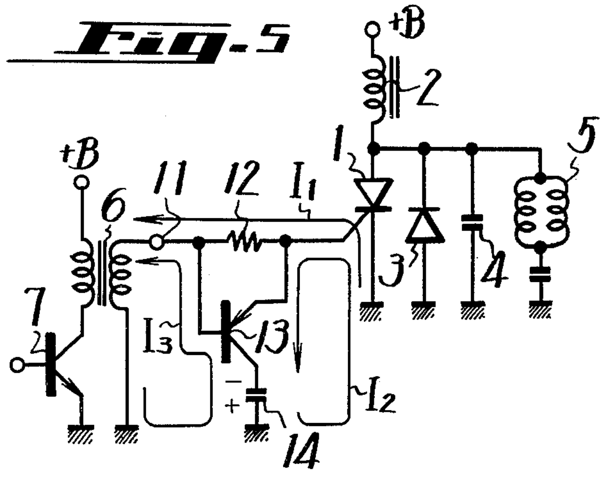
FIG. 5 and 6 are connection diagrams showing embodiments of the switching circuit according to the invention, respectively.

A first embodiment of the invention will be now described with reference to FIG. 5. The embodiment of FIG. 5 is the case that the present invention is applied to the horizontal deflection circuit which uses the driving transformer 6 as shown in FIG. 1. In FIG. 5, the reference numerals same as those used in FIG. 1 indicate the same elements, so that their description will be omitted.

In the embodiment of the invention shown in FIG. 5, between a driving signal supplying terminal or one end 11 of the secondary side of the driving transformer 6 and the control electrode of a switching element or the gate electrode of the GCS 1, there is connected a resistor 12 as a biasing element. The base-emitter path of a transistor 13 is connected between the both ends of the resistor 12 in parallel thereto and the collector of the transistor 13 is grounded through a capacitor 14.

Figures 7A, 7B, 7C, 7D:
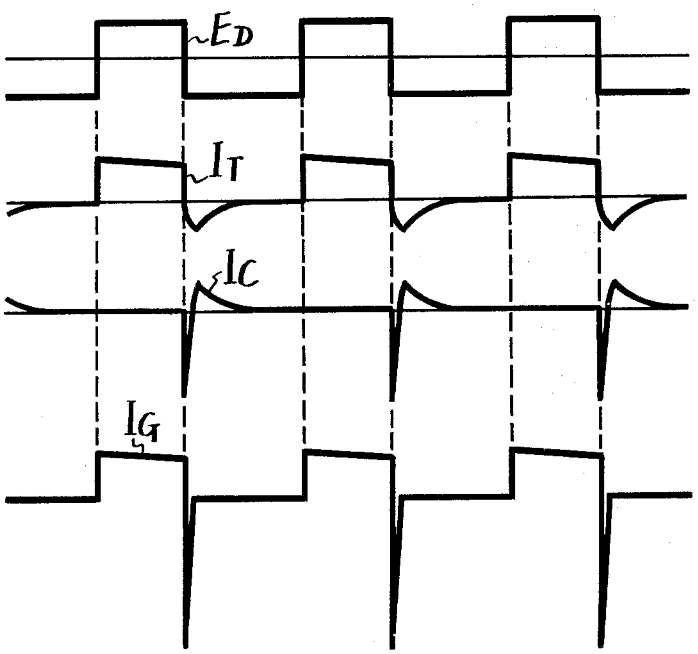
FIGS. 7A to 7D are waveform diagrams used for explaining the operation of the embodiments of the invention.

With the circuit shown in FIG. 5, when a driving voltage $E_D$ appeared at the driving signal supplying terminal 11 becomes positive, an ON-current is flowed through the resistor 12 to the gate of the GCS 1 to make the GCS 1 ON. At this time, the base-emitter of the transistor 13 is biased reversely with the voltage appeared across the resistor 12, so that the transistor 13 is made OFF. On the other hand, when the driving voltage $E_D$ appeared at the terminal 11 becomes negative, an electric charge is derived from the gate of the GCS 1 or a current $I_1$, which is opposite to that flowing through the resistor 12 when the driving voltage $E_D$ is positive, flows through the resistor 12, so that the base-emitter of the transistor 13 is biased forwardly and the transistor 13 is made ON. When the transistor 13 becomes ON, an electric charge stored in the capacitor 14 with the polarity shown in FIG. 5 acts to reversely bias the gate-cathode of the GCS 1 or the capacitor 14 acts as a reverse bias source of low impedance for the GCS 1 to flow a current $I_2$ in the direction as shown in FIG. 5. Thus, an electric charge is derived from the gate of the GCS 1 instantaneously and consequently the GCS 1 is made OFF immediately. Although the electric charge stored in the capacitor 14 is discharged instantaneously, the driving voltage $E_D$ obtained at the terminal 11 is still negative after the GCS 1 has been made OFF. As a result, a current $I_3$ flows in the direction shown in FIG. 5 to charge the capacitor 14 with the polarity shown in the figure again. The above states are shown by the waveforms of FIGS. 7A to 7D. In FIGS. 7A to 7D, reference letter $E_D$ represents the driving voltage obtained at the terminal 11, $I_T$ the current flowing through the secondary coil of the transformer 6, $I_C$ the current flowing through the capacitor 14, and $I_G$ the gate current of the GCS 1. In FIG. 7C, when the current $I_C$ flows through the capacitor 14 to charge the same with the polarity shown in FIG. 5, the current $I_C$ is taken positive.

Figure 4:
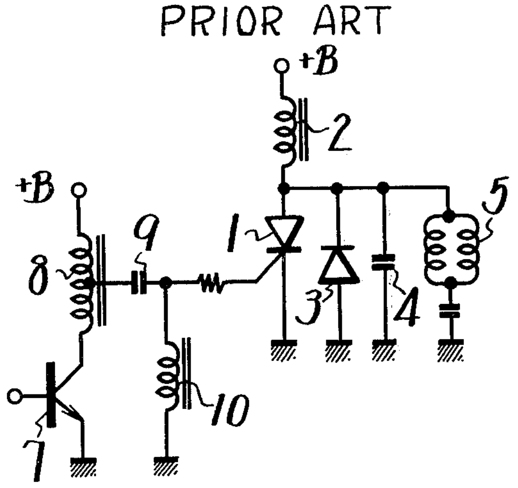
FIG. 4 PRIOR ART
FIG. 4 is a connection diagram showing another embodiment of the prior art horizontal deflection circuit.
Figure 6:
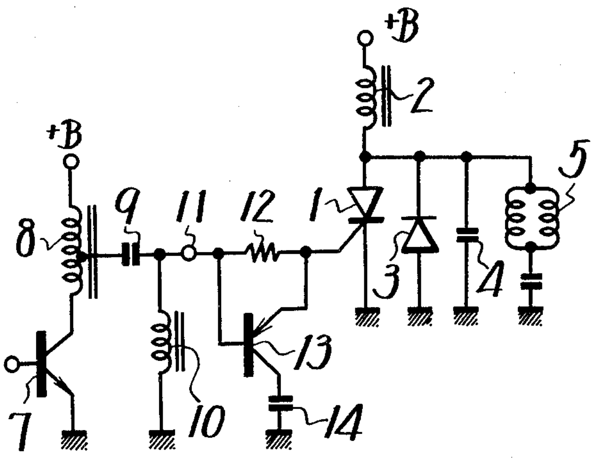

FIG. 6 shows another embodiment of the invention in which the invention is applied to the horizontal deflection circuit with the choke coil 8 having the tap as shown in FIG. 4. Accordingly, the elements of FIG. 6 same as those used in FIG. 4 are marked with the same reference numerals and their description will be omitted.

In the embodiment of FIG. 6, between the terminal 11, which is connected to the connection point of the capacitor 9 and the choke coil 10, and the gate of the GCS 1, there are connected the resistor 12 as the biasing element, the transistor 13 and the capacitor 14 similar to the embodiment of FIG. 5. The GCS 1 used in the embodiment of FIG. 6 is made OFF instantaneously.

With the present invention described as above, when the driving voltage arrives at the value to make the switching element OFF, the transistor 13 is made ON by the biasing element 12 and the capacitor 14, which is charged up previously, serves as a constant voltage source of low impedance for reversely biasing relative to the switching element or the GCS 1 in the illustrated embodiment. Thus, the electric charge is derived from the gate of the GCS 1 immediately and hence the storage time is made very short as may be apparent from FIG. 7D to make the GCS 1 OFF at once and to perform the safe and positive switching operation.

In the above and illustrated embodiments, the resistor is used as the biasing element, but a diode can be used in place of the resistor with the same effects.

Further, the present invention can be adopted in the case that a transistor or the like is used as the switching element instead of the GCS.

It will be apparent that many variations and modifications could be effected by one skilled in the art without departing from the spirits and scope of the novel concepts of the present invention.

I claim as my invention:

1. A switching circuit comprising;

a. means for producing a driving signal;

b. a switching element having at least a control electrode;

c. a biasing element connected between said driving signal producing means and the control electrode of said switching element;

d. a transistor having base, emitter and collector electrodes, the base-emitter path of said transistor being connected across said biasing element; and e. a capacitor connected between the collector electrode of said transistor and a reference voltage.

2. A switching circuit as claimed in claim 1, in which said switching element is a gate controlled switch device.

3. A switching circuit as claimed in claim 2, in which said biasing element is a resistor.

* * * * *